(12) United States Patent
Gorman

(10) Patent No.: US 7,518,918 B2
(45) Date of Patent: Apr. 14, 2009

(54) METHOD AND APPARATUS FOR REPAIRING EMBEDDED MEMORY IN AN INTEGRATED CIRCUIT

(75) Inventor: Kevin Williams Gorman, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 201 days.

(21) Appl. No.: 11/275,827

(22) Filed: Jan. 31, 2006

(65) Prior Publication Data

US 2007/0177425 A1 Aug. 2, 2007

(51) Int. Cl.
*G11C 29/04* (2006.01)
*G11C 29/12* (2006.01)

(52) U.S. Cl. .................... 365/185.09; 365/201

(58) Field of Classification Search ............. 365/201, 365/185.09, 185.07; 714/710, 711, 30, 733, 714/7
See application file for complete search history.

(56) References Cited

U.S. PATENT DOCUMENTS

| | | | |
|---|---|---|---|
| 6,085,334 A | 7/2000 | Giles et al. | |
| 6,622,272 B1 | 9/2003 | Haverkamp et al. | |
| 6,640,321 B1 | 10/2003 | Huang et al. | |
| 6,651,202 B1 | 11/2003 | Phan | |
| 6,691,264 B2 | 2/2004 | Huang | |
| 6,771,549 B1 * | 8/2004 | Konuk et al. | 365/200 |
| 2003/0235092 A1 | 12/2003 | Micheloni et al. | |
| 2003/0237033 A1 | 12/2003 | Borri et al. | |
| 2004/0070418 A1 | 4/2004 | Zimlich | |
| 2004/0199843 A1 * | 10/2004 | Hansquine et al. | 714/733 |
| 2005/0018497 A1 | 1/2005 | Frankowsky | |
| 2005/0204234 A1 * | 9/2005 | Bacigalupo | 714/733 |
| 2006/0015788 A1 * | 1/2006 | Yamazaki et al. | 714/738 |
| 2006/0271831 A1 * | 11/2006 | Kang et al. | 714/718 |

* cited by examiner

*Primary Examiner*—J. H. Hur
*Assistant Examiner*—Douglas King
(74) *Attorney, Agent, or Firm*—Michael LeStrange

(57) ABSTRACT

A method and apparatus for correcting embedded memory that has been identified as being defective by a memory controller. The address of the defective memory is provided by the memory controller to Built-In Test (BIST) logic in combination with a Built-In Redundancy Analyzer (BIRA) to replace the defective memory element with a redundant element.

12 Claims, 5 Drawing Sheets

METHOD AND APPARATUS FOR REPAIRING EMBEDDED MEMORY IN AN INTEGRATED CIRCUIT

BACKGROUND

1. Technical Field of the Present Invention

The present invention generally relates to integrated circuits and embedded memory and, more specifically, to Built-In Self Test circuitry that repairs the embedded memory during operation of the integrated circuit.

2. Description of Related Art

Integrated circuits are increasingly relying upon larger amounts of embedded memory to meet functional and performance demands. The memory typically covers a significant area of the integrated circuit and, consequently, is subject to a number of potential defects (e.g., shorts, surface and the like). If any portion of the memory is defective the integrated circuit is inoperable or unreliable.

As part of the manufacturing process to increase yield, redundant memory elements are included that can be selectively interchanged with defective memory elements using repair registers and fuses. The fuses are used to store the information concerning the redundant memory elements and the defective memory elements they replace. During operation of the integrated circuit, this information is retrieved and loaded into repair registers such that the redundant memory elements are accessed in lieu of the corresponding defective memory elements.

A Built-In Self Test (BIST) and a Built-In Redundancy Analyzer (BIRA) are typically used to perform in-system testing and replacement of defective memory elements. The BIST is responsible for providing the necessary controls and stimuli to the memory during testing. The BIRA monitors the testing for any errors that indicate a defective memory element (e.g., a mismatch on a write/read combination) and performs the blowing of fuses or other means for indicating the redundant element that is to replace the defective memory element.

During operation of the integrated circuit, advanced memory controllers can typically identify a failing memory address. As a result of this identification, the memory controller will instruct the BIST to perform an in-system test on the memory and, hopefully, find and repair the defect. The BIST performs the in-system test using stimuli patterns for the entire addressing scheme of the memory. Unfortunately, this process may fail to properly identify the previous failing memory address due to pattern limitations and the like.

It would, therefore, be a distinct advantage to have a method and apparatus that provides a BIST that is capable of receiving a failing memory address directly from the memory controller and replacing the defective memory element using that address.

SUMMARY OF THE PRESENT INVENTION

In one aspect, the present invention is an integrated circuit with memory having memory elements and redundant memory elements. The integrated circuit includes a memory controller that accesses the memory and detects a defective memory element. The integrated circuit also includes a built-in self test and self repair circuit that receives the address for the defective memory element and replaces the defective memory element with a redundant memory element.

BRIEF DESCRIPTION OF THE DRAWINGS

The present invention will be better understood and its advantages will become more apparent to those skilled in the art by reference to the following drawings, in conjunction with the accompanying specification, in which.

DETAILED DESCRIPTION OF THE PREFERRED EMBODIMENT OF THE PRESENT INVENTION

The present invention is a method and apparatus for correcting embedded memory that has been identified as being defective by a memory controller. The present invention receives the address of the defective memory and uses Built-In Self Test (BIST) logic in combination with a Built-In Redundancy Analyzer (BIRA) to replace the defective memory element with a redundant element using the received address as explained below.

Figure 1:
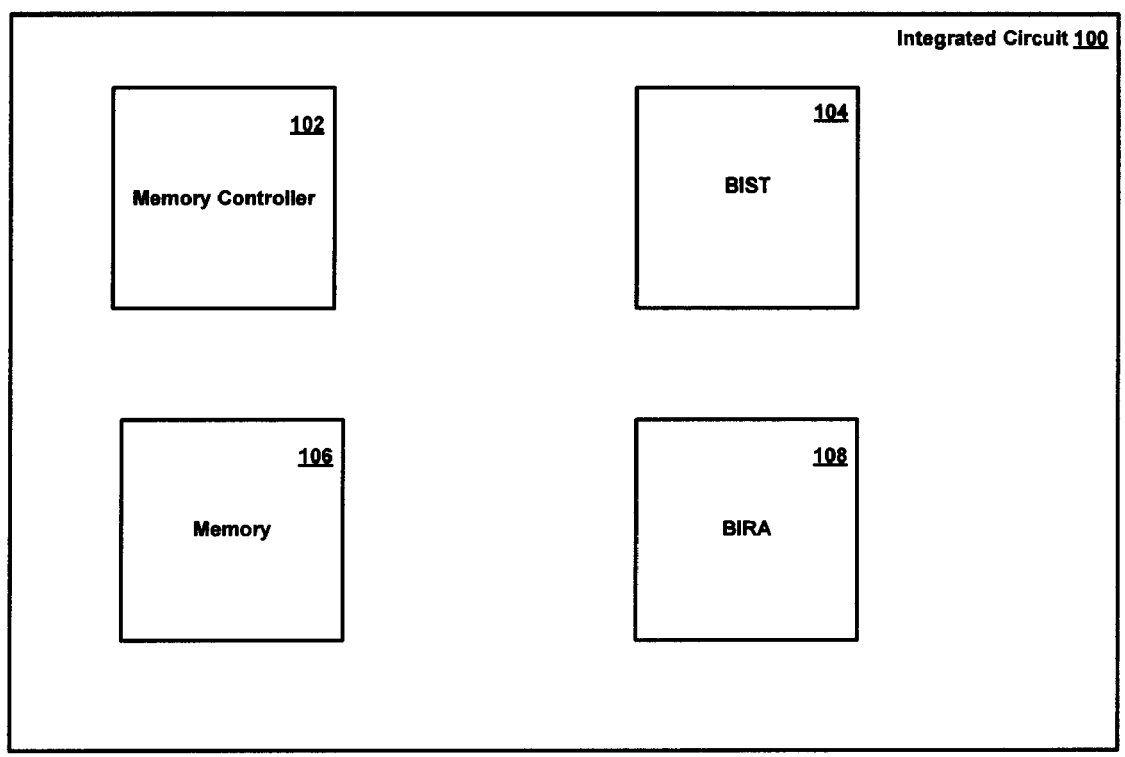
FIG. 1 is a diagram illustrating an integrated circuit that implements the teachings of the present invention.

Reference now being made to FIG. 1, a diagram is shown illustrating an integrated circuit 100 that implements the teachings of the present invention. Integrated circuit 100 includes a memory controller 102, a BIST 104, a BIRA 108, and memory 106. The interactions between these elements are explained in greater detail in connection with FIG. 2 below.

Figure 2:
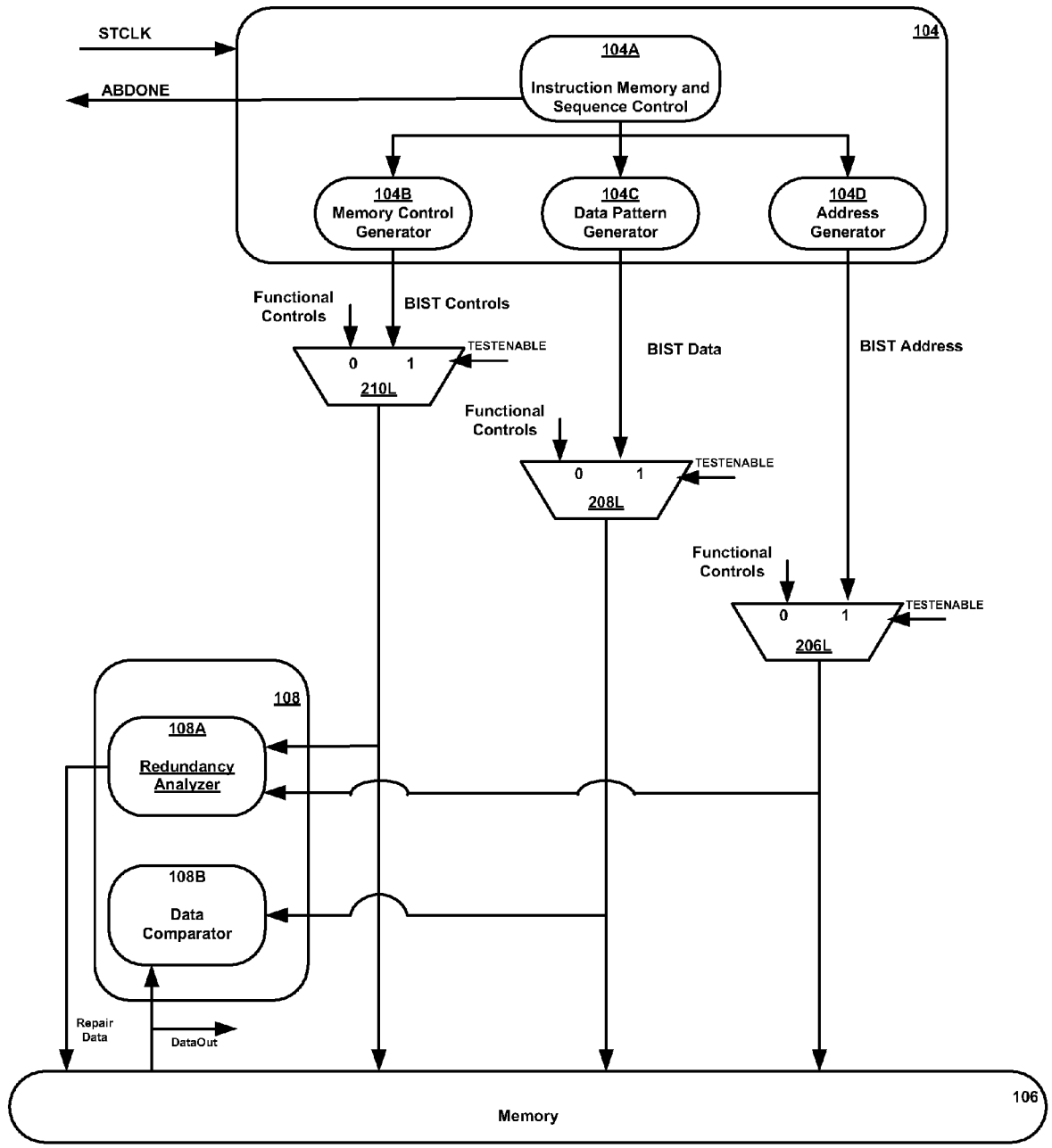
FIG. 2 is a circuit diagram illustrating in detail the basic elements of the BIST and BIRA of FIG. 1 according to the teachings of the present invention.

Reference now being made to FIG. 2, a circuit diagram is shown illustrating in detail the basic elements of BIST 104 and BIRA 108 of FIG. 1 according to the teachings of the present invention. BIST 104 includes instruction memory and sequence control 104A, memory control generator 104B, data pattern generator 104C, and address generator 104D. The function and operation of these BIST elements (104A-D) are well known and understood by those skilled in the art, and therefore, explanation of their operation is limited to the extent they have been influenced by the present invention.

Memory control generator 104B, data pattern generator 104C, and address generator 104D generate the BIST control signals (e.g., read/write control), BIST data (e.g., testing patterns), and BIST address (e.g., the address of the memory cell(s) to be read from or written to), respectively.

Multiplexers 206L-210L provide access from memory 106 to the memory controller 102 (via functional controls, functional data, and functional address signals) during normal operation and to the BIST 104 during in-system test operation via the TESTENABLE signal.

During in-system test, the memory controller 102 pulses the System Test Clock (STCLK) to cause the BIST 104 to cycle through the hard-coded pattern tests via the instruction memory and sequence control 104A as the BIRA 108 analyzes the output from the memory 106 for any errors (i.e., defective cells) in light of the values provided by the BIST control, BIST data, and BIST address. BIRA 108 includes a redundancy analyzer 108A and data comparator 108D. The redundancy analyzer 108A analyzes the test results and allocates redundant memory elements 106 to repair defective memory elements 106 as needed. Data comparator 108B compares the data obtained from memory 106 to the expected data produced by BIST 104. BIRA 108 repairs any defective cells in memory 104 with redundant cells, when available, and asserts the System Pass/Fail (SYSPF) signal if it was unable to complete repairs and/or the memory 106 failed the BIST 104 testing. BIST 104 asserts an ABDONE signal to inform the memory controller 102 that testing is complete.

As previously stated, the memory controller 102 can identify defective memory 106 cells during operation of the integrated circuit 100. The present invention uses the memory controller 102 to provide the address for the defective memory cell(s) 106 according to a preferred embodiment (FIG. 3) and an alternative preferred embodiment (FIG. 4) as explained below.

Figure 3:
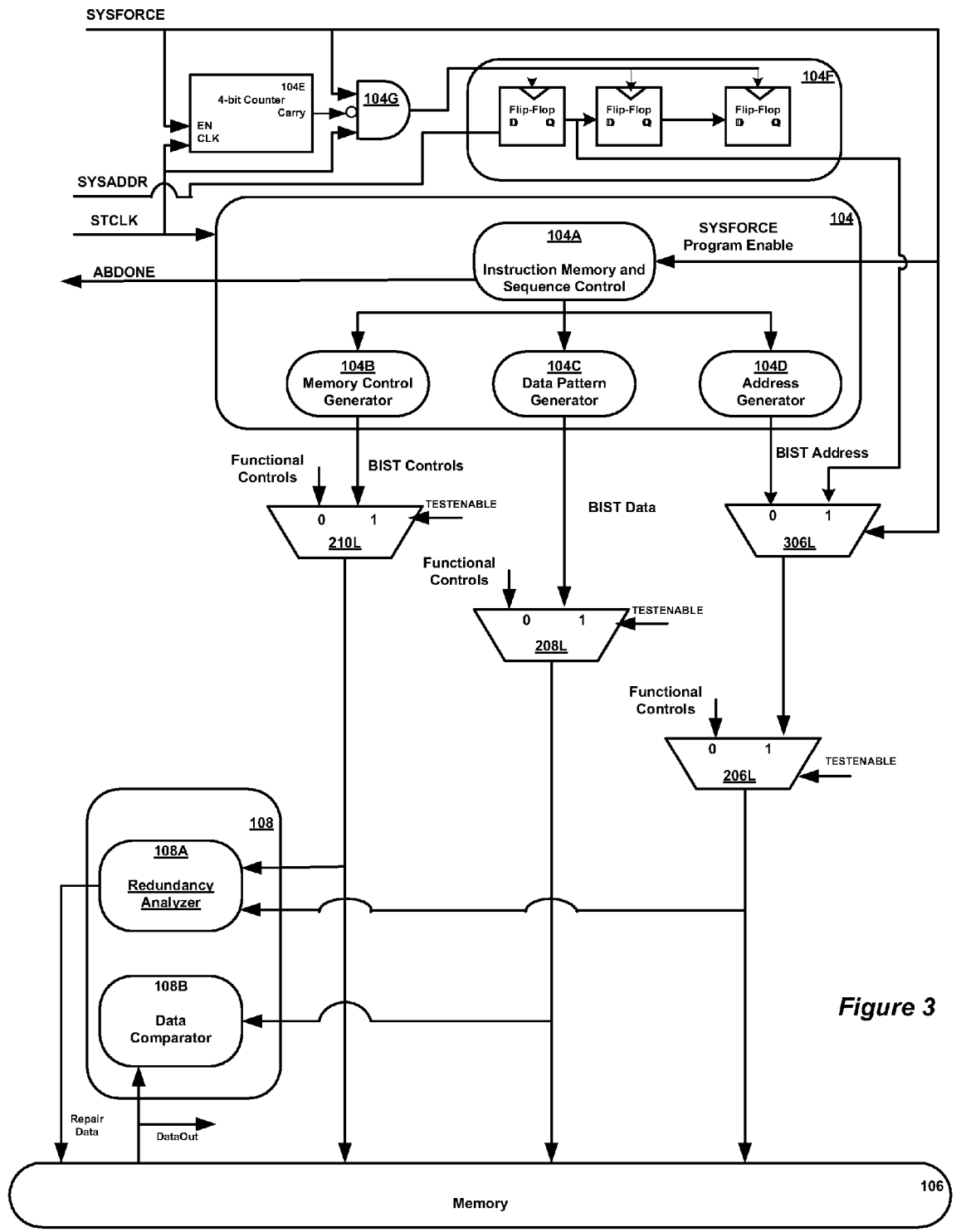
FIG. 3 is a circuit diagram illustrating the examples of the BIST and BIRA of FIG. 2 as modified according to the teachings of a preferred embodiment of the present invention.

Reference now being made to FIG. 3, a circuit diagram is shown illustrating the examples of the BIST 104 and BIRA 108 of FIG. 2 with additional elements according to the teachings of a preferred embodiment of the present invention. In the preferred embodiment, the BIST 104 of FIG. 1 has been modified to include a counter 104E, a register 104F, a logic gate 104G, and an additional multiplexer 306L between the address generator 104D and multiplexer 206L. In addition, new signals System Address (SYSADDR) and System Force (SYSFORCE) have also been added.

The SYSFORCE signal is used for indicating that the memory controller 102 is supplying a failing memory 106 address via serial input SYSADDR. The counter 104E uses the SYSFORCE signal to increment on each STCLK signal and carry when saturated. In the preferred embodiment of the present invention, the counter 104E is illustrated as a 4-bit counter in order to assist in the storing of the 16-bit failing address as explained below. In other designs, the length of counter 104E would be adjusted according to the length of the address.

The failing memory 106 address is serially loaded into the register 104F using the carry output (inverted) of the counter 104E in combination with the STCLK and SYSFORCE signals as output from an AND gate 104G.

Multiplexer 306L is used to provide the failing address from the register 104F to multiplexer 206L when the SYSFORCE signal is asserted and from the address generator 104D when SYSFORCE signal is not asserted.

SYSFORCE is also used to cause the BIST Instruction Memory and Sequence Control 104A to execute a particular pre-defined test sequence that will result in an attempt to repair the failing memory 106 address.

The operation of these modifications is explained in greater detail in connection with the flow chart of FIG. 5.

Figure 4:
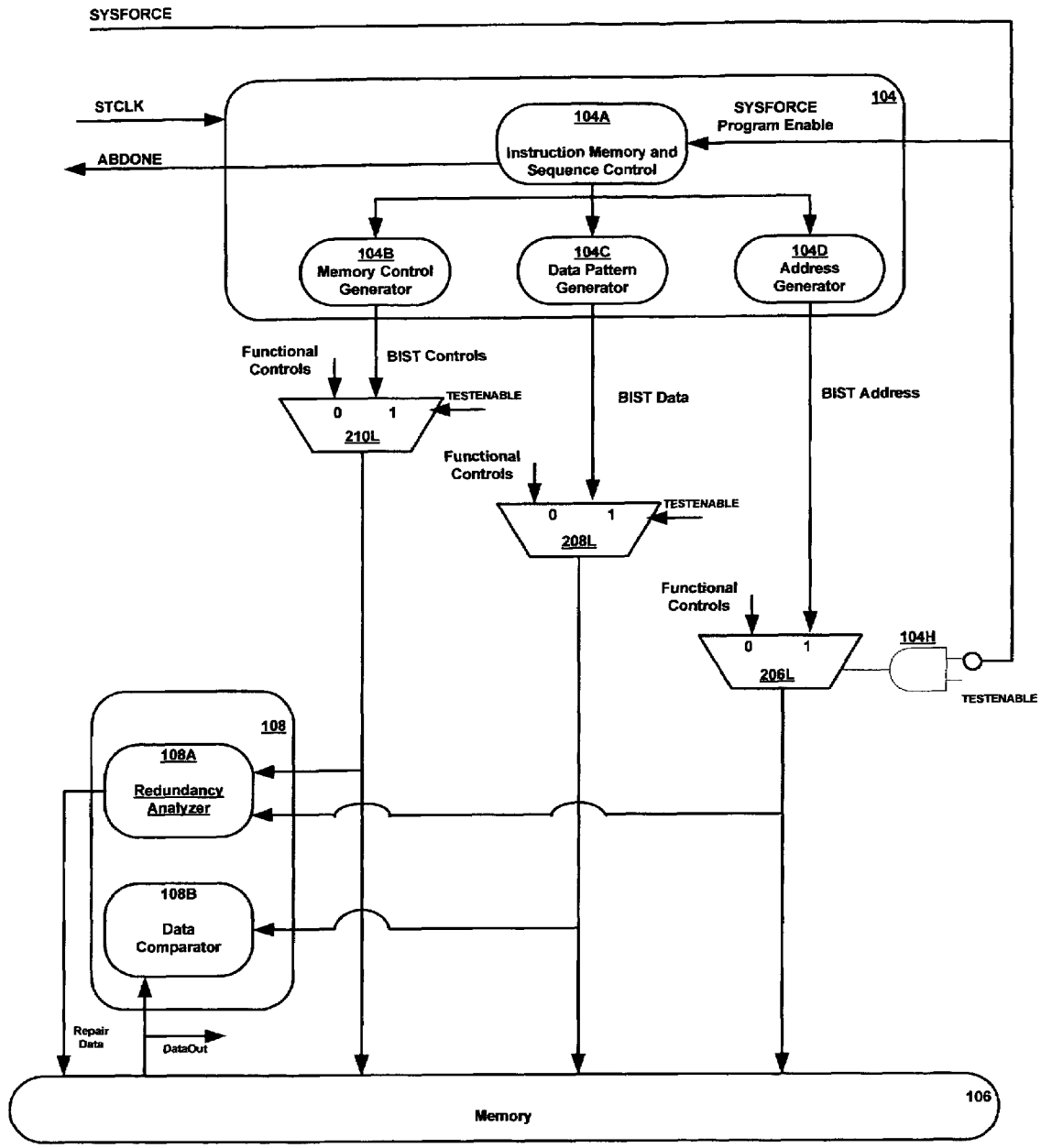
FIG. 4 is a circuit diagram illustrating modifications to the BIST and BIRA of FIG. 2 according to the teachings of an alternative preferred embodiment of the present invention.

Reference now being made to FIG. 4, a circuit diagram is shown illustrating modifications to the BIST 104 and BIRA 108 of FIG. 2 according to the teachings of an alternative preferred embodiment of the present invention. In the alternative preferred embodiment of the present invention, the memory controller 102 provides the failing memory address during the entire process of testing and replacement. The BIST 104 has been modified to include SYSFORCE signal and an AND gate 104H.

New signal SYSFORCE is provided to indicate that the memory controller 102 is providing the failing memory 106 address and is used by the BIST 104 and AND gate 104H to enable multiplexer 206L to use the address provided by the memory controller 102 during this special in-system repair procedure.

SYSFORCE is also used to cause the BIST Instruction Memory and Sequence Control 104A to execute a particular pre-defined test sequence that will result in an attempt to repair the failing memory 106 address.

Both the preferred embodiment and the alternative preferred embodiment use the address of the failing memory cell(s) 106 provided from the memory controller 102 as explained in connection with FIG. 5 below.

Figure 5:
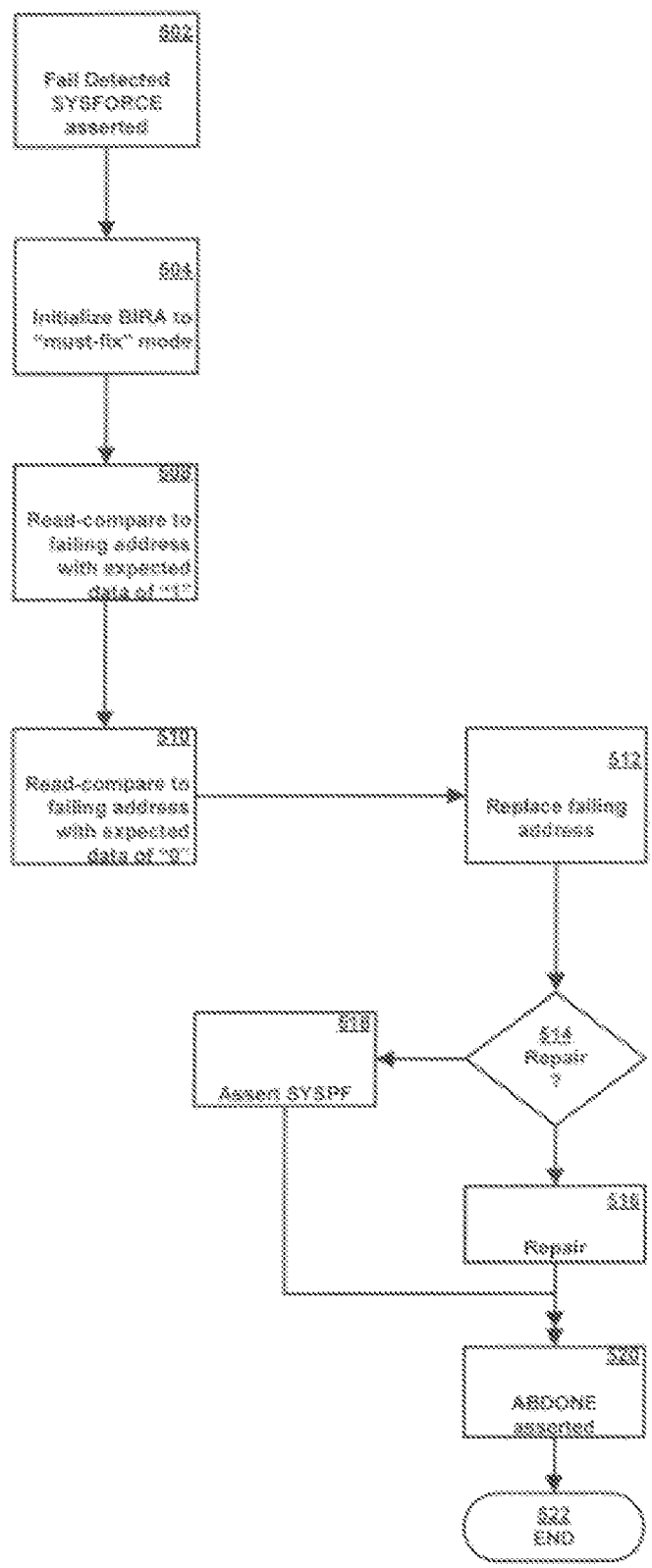
FIG. 5 is a flow chart illustrating the method for correcting defective memory cells in memory during operation of the integrated circuit of FIG. 1 according to the teachings of the present invention.

Reference now being made to FIG. 5, a flow chart is shown illustrating the method for correcting defective memory cells in memory 106 during operation of the integrated circuit 100 according to the teachings of the present invention. The correction method begins when the memory controller 102 (FIG. 1) detects a defective memory cell(s) in memory 106 (Step 502). The memory controller 102 then provides the failing address to the BIST 104.

In the preferred embodiment (FIG. 3), the failing address is provided serially via SYSADDR, stored in the Register 104F, and provided to the multiplexer 206L. In the alternative preferred embodiment (FIG. 4), the failing address is provided by the memory controller 102 directly to the multiplexer 206L using the functional address.

After the loading (FIG. 3) or receipt (FIG. 4) of the failing address has been completed, the BIST 104 instructs the BIRA 108 to enter "must-fix" state. The must fix state is a state where any failing bit results in the BIRA 108 performing a redundancy replacement (Step 504). The TESTENABLE signal is asserted and the address is provided to the memory 106.

In the preferred embodiment, the SYSFORCE signal in combination with the TESTENABLE signal result in multiplexers 206L-210L, and 306L to provide the stored BIST address, the BIST data, and BIST controls.

In the alternative preferred embodiment, the SYSFORCE signal in combination with the TESTENABLE signal results in multiplexers 206L-210L in combination with AND gate 104H to provide the failing address (functional address from the memory controller 102), BIST data, and BIST controls.

The BIST 104 causes the state of the BIRA 108 to believe that all "1" values have already been written to the specified memory 106 address. The BIST 104 then issues a read command to read the data residing at the specified address. The BIRA 108 reads the data provided by the memory 106 and expects its values to all be set to "1" (Step 508). If any of the read data values are not equal to "1" then the BIRA 108 enters the redundancy replacement state (Step 512).

In case the read data values are all equal to "1" the BIST 104 causes the state of the BIRA 108 to believe that all "0" values have already been written to the specified memory 106 address. The BIST 104 then uses BIST controls signals to inform the memory 106 to perform a read at the specified address. The BIRA 108 reads the data provided by the memory 106 and expects its values to all be set to "0" (Step 510). If any of the read data values are not equal to "0" then the BIRA 108 enters the redundancy replacement state (Step 512). Forcing the BIRA to expect either a "1" or "0" value without having actually performed any writes to the specified address guarantees that the memory data will fail one of the reads.

If possible, the BIRA 108 replaces the failing memory cell(s) 106 with a redundant element using techniques that are well known and understood (Steps 514 and 516). If the BIRA 108 is unable to repair the failing memory cell(s) 106 then the SYSPF signal is asserted (Steps 514 and 518).

The correction method continues by informing the memory controller 102 that the repair process has been completed via the ABDONE signal (Step 520). The correction method then ends upon the memory controller 102 de-asserting the SYSFORCE signal and cease pulsing the STCLK (Step 522).

It is thus believed that the operation and construction of the present invention will be apparent from the foregoing description. While the method and system shown and described has been characterized as being preferred, it will be readily apparent that various changes and/or modifications could be made without departing from the spirit and scope of the present invention as defined in the following claims.

The invention claimed is:

1. An integrated circuit comprising:
    an embedded memory array having a plurality of first addressable memory locations and a second plurality of adressable memory locations mappable to the first plurality of addressable memory locations;
    a memory controller capable of accessing the memory array and adapted to detect a defective memory location during functional operation of the integrated circuit;
    a built-in self test (BIST) element adapted to receive an address corresponding to the defective memory location and generate a plurality of control signals to direct read and write access of and to the memory array, test pattern stimuli data, and address locations to be accessed; and
    a built-in redundancy analyzer (BIRA) capable of receiving the contents of an address corresponding to the defective memory location, comparing with an expected result from the BIST element and replacing the defective memory location utilizing a redundant memory address from the second plurality of addressable memory locations when a miscompare occurs between a received data and an expected data.

2. The integrated circuit of claim 1 wherein the BIRA further comprises a comparator element configured to compares a first read data received from one of the plurality of addressable memory locations with a value that will not match the first read data.

3. The integrated circuit of claim 1 wherein the BIST includes:
    an address generator for generating memory addresses during testing; and
    circuitry that is activated by a signal to use the received address that corresponds to the defector memory location instead of the addresses generated by the address generator.

4. The integrated circuit of claim 1 wherein the BIRA includes:
    circuitry that monitors data sent to the memory from the BIST, receives data from memory, compares the monitored data with the received data, and replaces a memory location with a redundant memory location when the received fails to match the monitored data; and
    circuitry that ensures that the data received from the defective memory location detected by the memory controller will not match a predetermined value, resulting in the replacement of the defective memory location with a redundant memory location.

5. A method of repairing embedded memory of an integrated circuit during operation of the integrated circuit, the method comprising:
    detecting a defective memory location with an embedded memory controller during functional operation of the integrated circuit;
    transmitting the address of the defective memory location to a built-in self test circuit having an address generator that generates memory addresses during operation of the built-in self test circuit;
    accessing the defective memory location with the built-in self test circuit using the transmitted address instead of the generated addresses;
    reading data from the defective memory location and comparing the data with a value that will fail to match the data; and
    replacing the defective memory location with a redundant memory location.

6. The method of claim 5 wherein the step of reading the defective memory location includes the step of:
    reading data, with a built-in redundancy analyzer, from the defective memory location and comparing the data with a value that will fail to match the data.

7. The method of claim 6 wherein the step of replacing the defective memory location, includes the step of:
    replacing, with the built-in redundancy analyzer, the defective memory location with a redundant memory location.

8. The method of claim 5 wherein the step of reading data includes the step of:
    reading data from the defective memory location, even though the built-in self test circuit has not written any data to the defective memory location, and comparing the data with a value that will fail to match the data.

9. The method of claim 8 wherein the step of reading data is performed by a built-in redundancy analyzer circuit.

10. The method of claim 9 wherein the value is all ones or all zeros.

11. An apparatus for repairing embedded memory of an integrated circuit during operation of the integrated circuit, the apparatus comprising:
    means for detecting a defective memory location with an embedded memory controller during functional operation of the integrated circuit;
    means for transmitting the address of the defective memory location to a built-in self test circuit having an address generator that generates memory addresses during operation of the built-in self test circuit;
    means for accessing the defective memory location with the built-in self test circuit using the transmitted address instead of the generated addresses;
    means for reading data from the defective memory location and comparing the data with a value that will fail to match the data; and
    means for replacing the defective memory location with a redundant memory location.

12. The apparatus of claim 11 wherein the means for reading the defective memory location includes:
    means for reading data, with a built-in redundancy analyzer, from the defective memory location and comparing the data with a value that will fail to match the data.

* * * * *